(12) United States Patent
Nair et al.

(10) Patent No.: US 12,416,093 B2
(45) Date of Patent: Sep. 16, 2025

(54) ELECTROLESS PLATING PROCESS

(71) Applicant: Intel Corporation, Santa Clara, CA (US)

(72) Inventors: Chandrasekharan Nair, Mesa, AZ (US); Darko Grujicic, Chandler, AZ (US); Rengarajan Shanmugam, Chandler, AZ (US); Srinivasan Raman, Chandler, AZ (US); Roy Dittler, Chandler, AZ (US); Daniel Sowa, Casa Grande, AZ (US); Robert Baresel, II, Gilbert, AZ (US); Marcel Wall, Phoenix, AZ (US); Rahul Manepalli, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 798 days.

(21) Appl. No.: 17/482,513

(22) Filed: Sep. 23, 2021

(65) Prior Publication Data

US 2022/0010452 A1  Jan. 13, 2022

(51) Int. Cl.
| | |
|---|---|
| C25D 17/06 | (2006.01) |
| C23C 18/16 | (2006.01) |
| C25D 17/00 | (2006.01) |
| C25D 17/12 | (2006.01) |
| H01L 21/67 | (2006.01) |

(52) U.S. Cl.
CPC ........... *C25D 17/06* (2013.01); *C23C 18/163* (2013.01); *C23C 18/1642* (2013.01); *C25D 17/008* (2013.01); *C25D 17/12* (2013.01); *H01L 21/6723* (2013.01)

(58) Field of Classification Search
CPC ............................. C23C 1/163; C23C 18/1642
See application file for complete search history.

(56) References Cited

U.S. PATENT DOCUMENTS

| | | | | |
|---|---|---|---|---|
| 5,411,918 | A  * | 5/1995 | Keible | H01L 23/5329 257/737 |
| 6,713,122 | B1 * | 3/2004 | Mayer | C23C 18/1669 134/28 |
| 7,033,465 | B1 * | 4/2006 | Patton | C23C 18/1605 204/227 |
| 2004/0065540 | A1 * | 4/2004 | Mayer | H01L 21/32134 257/E21.309 |
| 2007/0085205 | A1 * | 4/2007 | Chen | H01L 24/82 257/737 |
| 2013/0034959 | A1 * | 2/2013 | Chen | C23C 18/1666 257/E21.295 |

* cited by examiner

*Primary Examiner* — Dah-Wei D. Yuan
*Assistant Examiner* — Kristen A Dagenais
(74) *Attorney, Agent, or Firm* — VIERING, JENTSCHURA & PARTNER mbB (57) ABSTRACT

The present disclosure is directed to an electroless plating process using a panel basket for holding semiconductor panels comprising a plurality of metal pads and shielding the metal pads from contaminants and over-etching and under-etching caused by the contaminants.

13 Claims, 7 Drawing Sheets

ELECTROLESS PLATING PROCESS

BACKGROUND

Reducing yield losses or reliability issues during semiconductor plating has become increasingly important. Among the major defects that may be attributed to the semiconductor plating are voids or organic/inorganic residues in plated vias. The above described defects are major yield loss factors that may need to be addressed.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

Figure 1A:
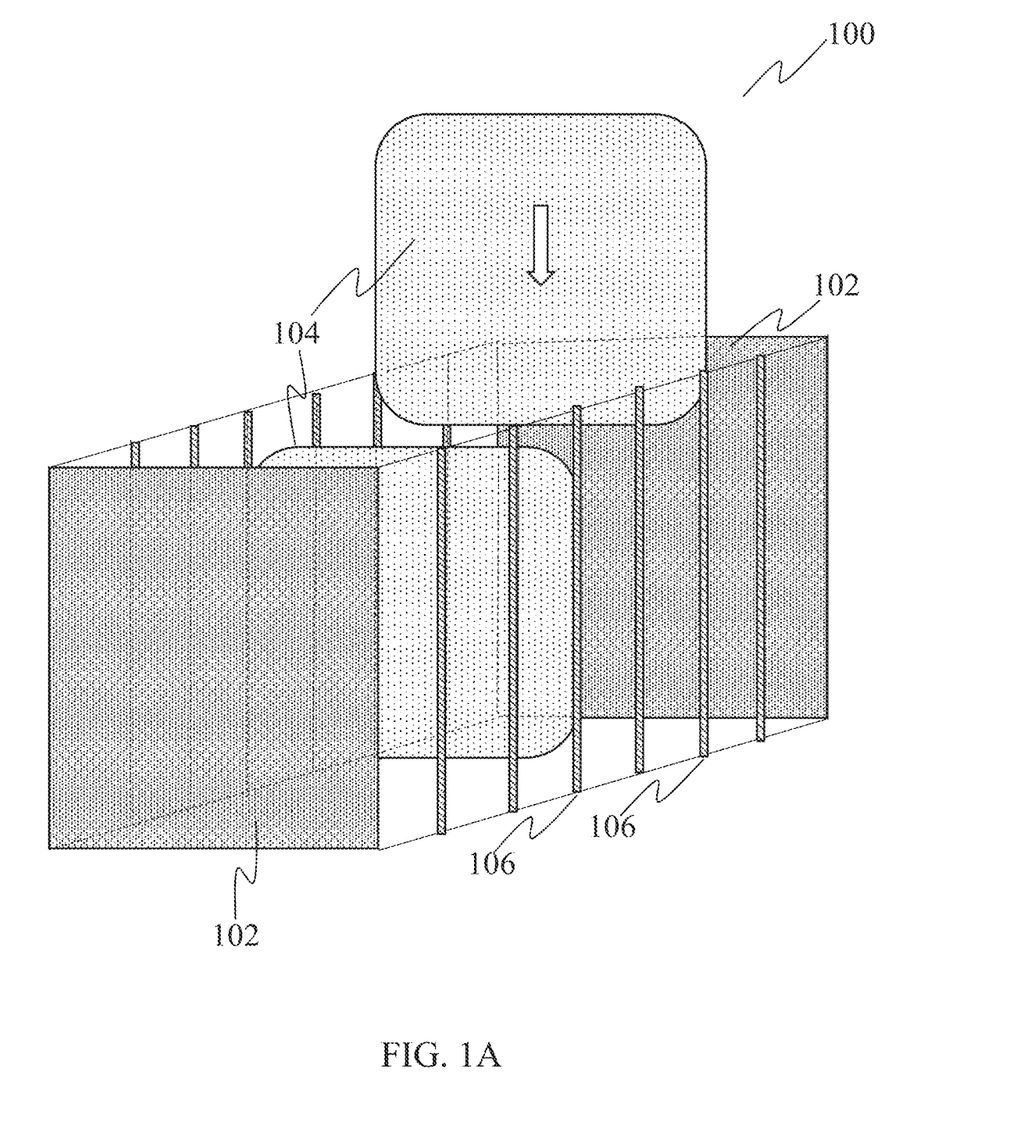
FIG. 1A schematically shows a conventional panel basket configured with two panel end plates, opposing slots and including semiconductor panels.
Figure 1B:
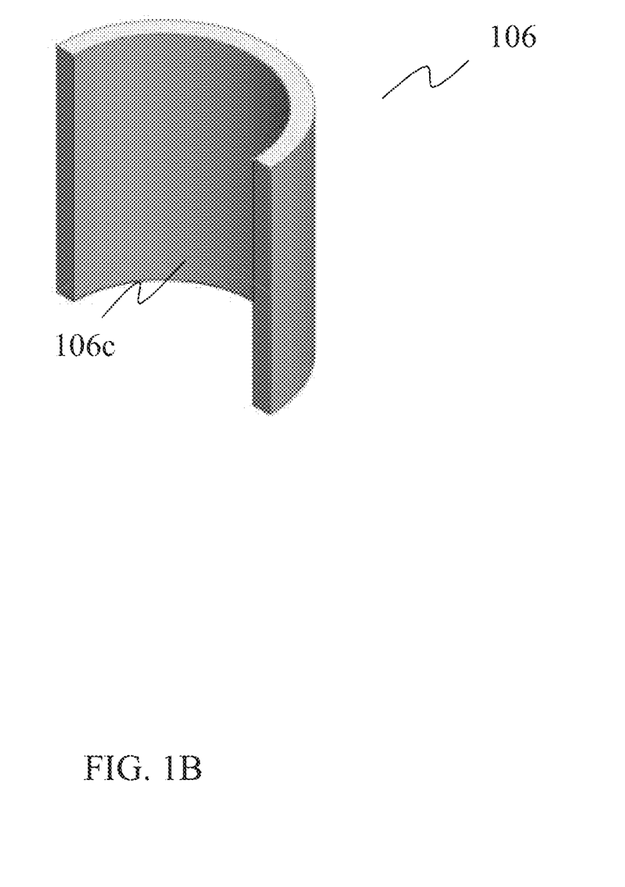
FIG. 1B schematically shows a perspective view of a segment of a slot of panel basket.

In the semiconductor packaging industry, organic or glass-based rectangular substrates called semiconductor panels often undergo a plating process, typically with a view to produce vias as a through-connection. For such a plating process, a panel basket 100, as shown in FIG. 1A, may be used and the semiconductor panels 104 may be aligned therein between panel end plates 102 and in a plurality of opposing slots 106. Each slot of the plurality of opposing slots 106 may be shaped to retain a semiconductor panel 104 in place. As shown in FIG. 1B, each slot of the plurality of opposing slots 106 may have, for example, a semi-cylinder shape including a concave portion 106c, wherein two concave portions 106c of a pair of opposing slots 106 may be facing each other, so as to jointly fixate the semiconductor panel 104 in between. The plating process is typically preceded by a pretreatment, which may be a copper pad etching.

Figure 2:
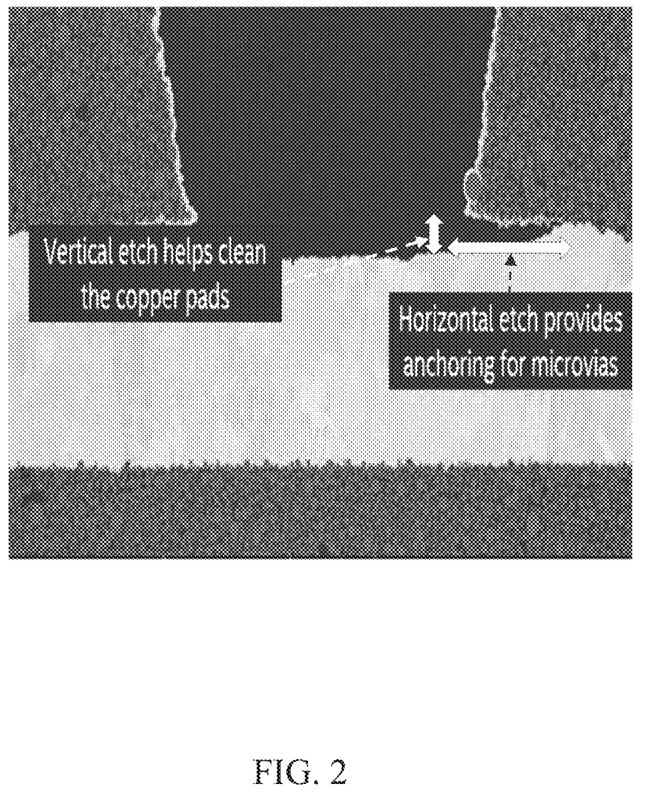
FIG. 2 shows a horizontal etch and a vertical etch of a copper pad after a copper pad etching pretreatment.

As shown in FIG. 2, the copper pad etching in the electroless plating module typically helps in cleaning the metal pads as well as providing anchors for the vias. In the copper pad etching, a significant amount of entrapped organic/inorganic residues are also removed from the copper pads. The copper pad etching typically involves an oxidizing solution, such as a sodium persulfate solution, in a concentration of about 10 g/L to about 200 g/L.

However, during such copper pad etching, the semiconductor panels 104 proximate to the panel end plates 102 may experience over-etching and under-etching, and this non-uniformity in the etching may cause micro-via reliability/yield issues in package substrates. For example, over-etching of the metal pads (e.g., copper pads) may occur for those metal pads designed to form vias on the semiconductor panel side that is positioned facing the panel end plates 102, and may cause voids in the plated vias after plating. Under-etching of metal pads (e.g., copper pads) may occur in the same semiconductor panel 104 and may result in organic/inorganic residues to be erroneously placed in the plated vias of the semiconductor panel side that is positioned avert from the panel end plates 102. The reliability/yield issues caused from over-etching and under-etching may only be detected after the plating process.

It is possible that the non-uniformity in the etching of the metal pads may be due to contaminants arising from the panel end plates 102. In particular, the contaminants may be palladium residues that may have precipitated and/or adsorbed on the surface of the panel baskets during or after the activation of the electroless plating process. Additionally or alternatively, in some panel baskets where the panel end plates are made from stainless steel, the contaminants are iron derived from the stainless steel. These iron and/or palladium contaminants may catalytically generate a high, localized concentration of persulfate anions, hydroxyl ions and radicals in a copper pad etching solution. This concentration difference of persulfate anions, hydroxyl ions and radicals between the semiconductor panel side facing the panel end plates 102 and the side facing away from the panel end plates 102 may generate an electrochemical potential difference (as governed by Nernst equation) and cause the over-etching and/or under-etching (through galvanic coupling) of the metal pads. The chemical species formed in the solution due to these effects described above can be dispersed by agitation or diffusion phenomenon in the copper pad etching process, thereby affecting panels placed throughout the basket to varying degrees.

Figure 3:
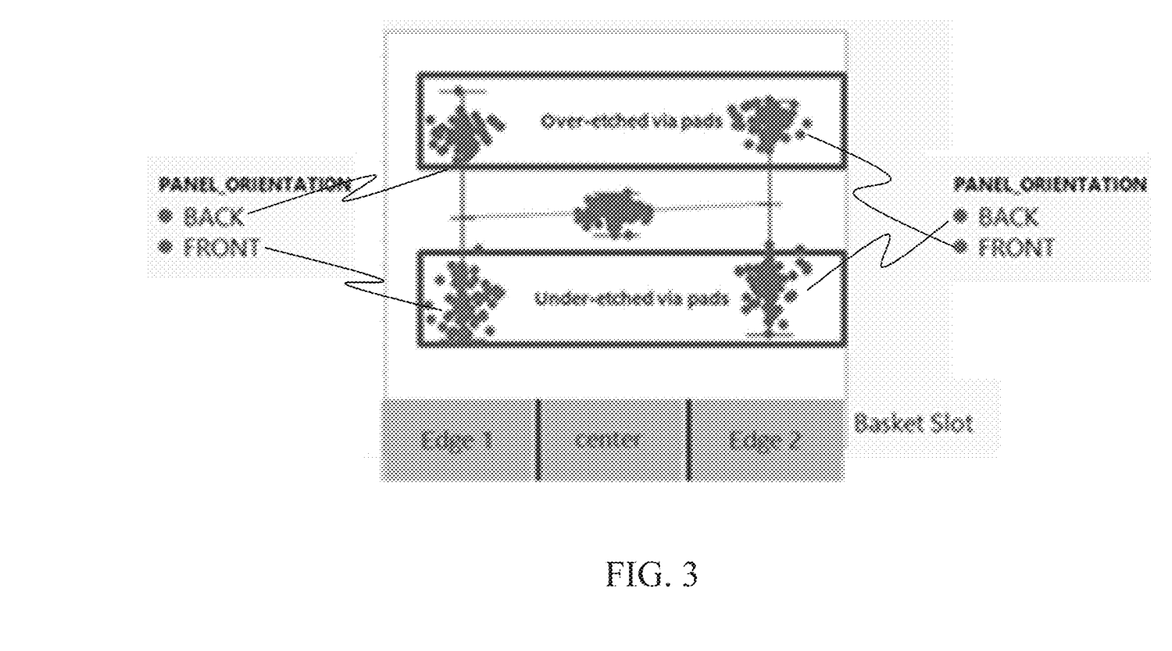
FIG. 3 shows the copper pad etch depth as measured by laser profilometry, before and after a copper pad etching pretreatment for a conventional electroless plating process.

FIG. 3 shows the profilometry as obtained for plated semiconductor panels 104 after a conventional electroless plating process. The data reveals that, with a conventional panel basket 100 (e.g., stainless steel basket), the copper pads of semiconductor panels 104 at the edge slots near the panel end plates 102 (in this case, edge 1 slot and edge 2 slot) show significant over-etching and under-etching behavior compared to the semiconductor panel 104 in the center slot. Hence, this over-etching and under-etching behavior is seen predominantly in semiconductor panel 104 near the panel end plates 102 ("edge slot panels"). The backside of the semiconductor panel 104 in edge 1 slot is facing the panel end plate and hence, the copper pads in the backside of the semiconductor panel 104 in the edge 1 slot shows over-etching behaviour. The copper pads of the connected via nets on the front side of the same semiconductor panel in edge 1 slot show an under-etching behavior.

To address these shortcomings, in an aspect, there is disclosed an electroless plating process using a panel basket 200. The process may include placing semiconductor panels 204 including a plurality of metal pads into the panel basket 200. The process may include shielding the metal pads from over-etching and under-etching. The process may include performing electroless plating process steps with the semiconductor panels 204. The panel basket 200 may be made of a basket material, selected from, e.g., stainless steel, titanium, a robust polymer that withstands corrosion (e.g., polyether ether ketone (PEEK)), or combinations thereof.

As discussed above, it is believed that the over-etching and under-etching may be caused by contaminants (e.g., iron and/or palladium contaminants) as a result from proximity to the panel end plates 102 during the copper pad etching pretreatment. Accordingly, the process as disclosed herein advantageously provides a shielding of the metal pads, such that contact of the contaminants with the metal pads may be avoided. Hence, the term "shielding", as used herein, refers to providing a distance in time and/or space and/or electrical conduction between the contaminants and the metal pads and generally protecting the metal pads from contamination.

According to some aspects, the shielding of the metal pads may include avoiding a high, localized concentration of persulfate anions, hydroxyl ions and radicals. The high, localized concentration of persulfate anions, hydroxyl ions and radicals may be the reaction product of a catalytic chain reaction with contaminants, such as iron, from a stainless steel basket and/or palladium derived from a palladium-catalyzed activation pretreatment prior to the electroless plating. By decreasing the concentration, or substantially preventing the presence of the contaminants during the copper pad etching pretreatment at the metal pads, the catalytic chain reaction that may be generating a high concentration of persulfate anions and radicals in the copper pad etching solution may be hindered or substantially avoided, thereby preventing the over-etching and/or under-etching (through galvanic coupling) of the metal pads.

Figure 4A:
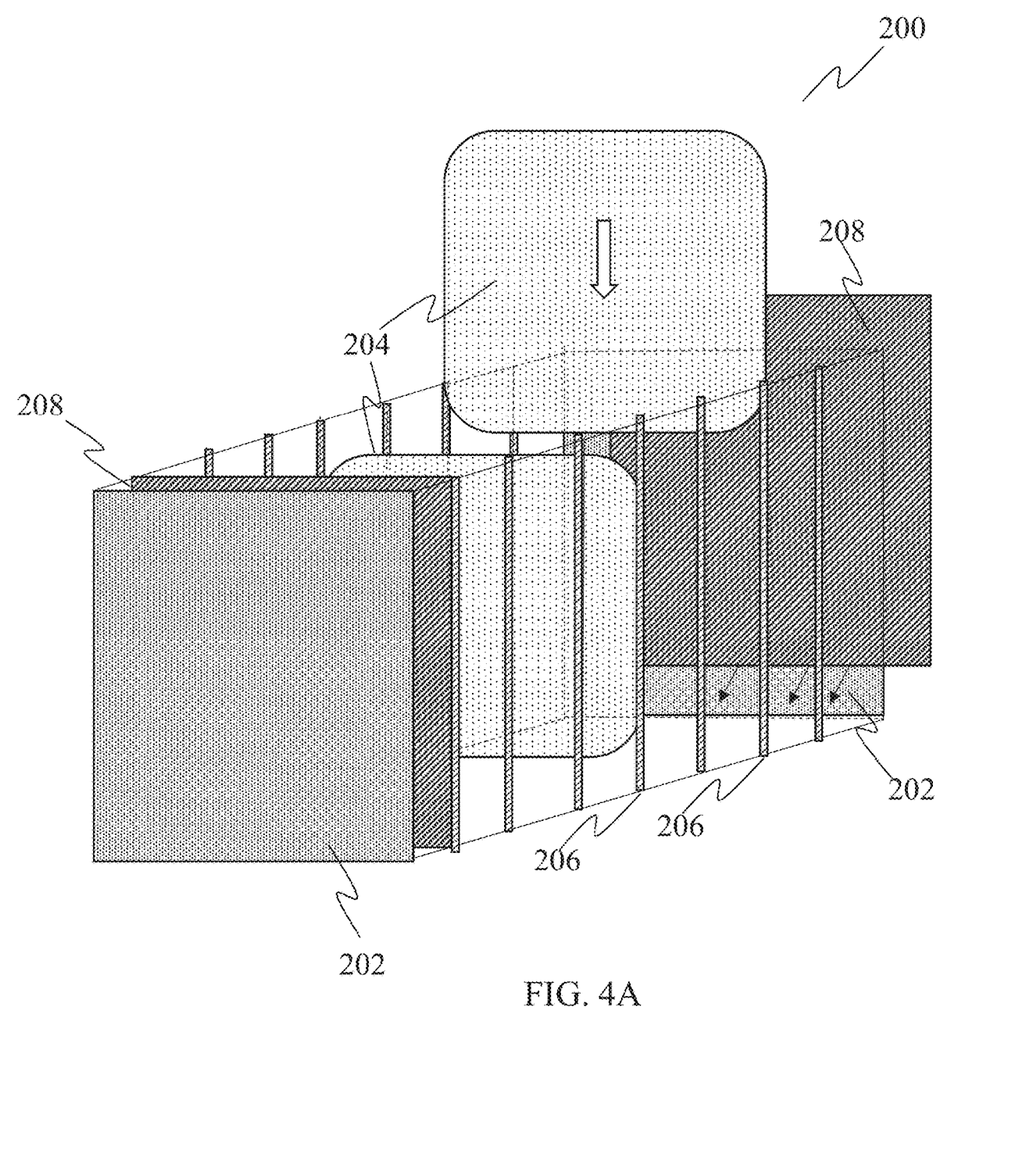
FIG. 4A schematically shows a panel basket configured with two panel end plates, opposing slots, insulating inserts and including semiconductor panels according to the invention.

With reference to FIG. 4A, the shielding of the metal pads may include providing insulating inserts 208 into proximity of selected sections of the panel basket made of the basket material. "Proximity", or "proximal", in this context, refers to the distance between the basket material and the insulating insert 208 being between 0 mm to about 5 mm. A distance of 0 mm would be understand to refer to a "direct contact".

In one aspect, the insulating insert 208 may be placed or positioned proximal to the two panel end plates 202. These insulating inserts 208 may provide a distance in space between the contaminants and the metal pads. Advantageously, by preventing the electrical connection of the metal pads (e.g. copper pads) in the semiconductor panel 204 with the panel end plates, the catalytic chain reaction producing the persulfate anions or hydroxyl anions may not occur at the metal pads or may be sufficiently hindered. The insulating inserts 208 may be positioned between panel end plates 202 of a panel basket 200 and a semiconductor panel 204 with metal pads, thereby spatially diminishing or preventing the contact. The insulating inserts 208 may therefore have the function of a (spatial) shield from the contaminants, and therefore the product of the catalytic chain reaction, of the panel end plates 202.

Figure 4B:
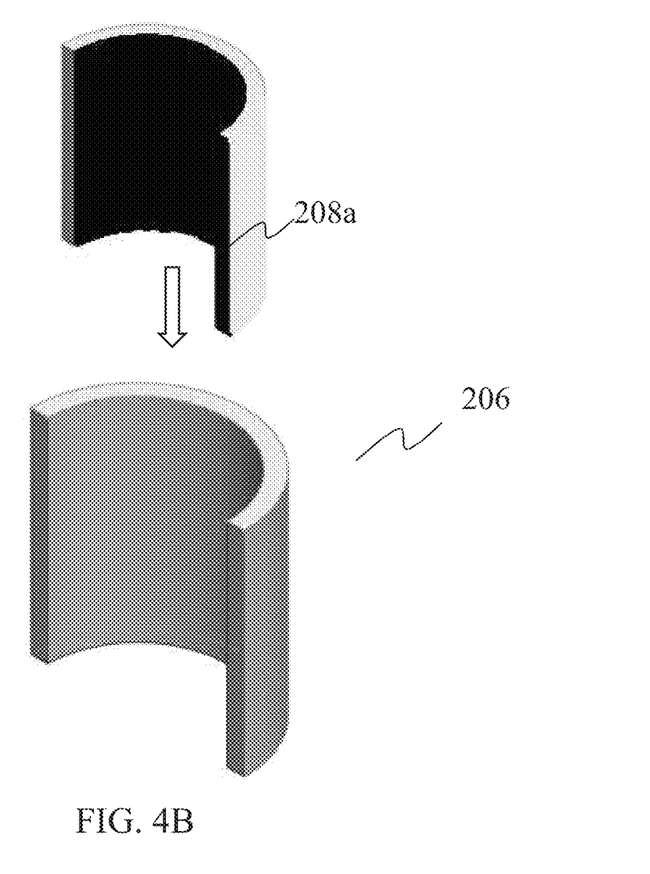
FIG. 4B shows a perspective view of a segment of a slot of the panel basket and an insulating insert being affixed thereon.

With reference to FIG. 4B, the insulating insert 208a may be placed or positioned proximal to the opposing slots 206. Similarly, these insulating inserts 208a may provide a distance in space between the contaminants and the metal pads. Advantageously, by preventing the electrical connection of the metal pads (e.g. copper pads) in the semiconductor panel 204 with the opposing slots 206, the catalytic chain reaction producing the persulfate anions or hydroxyl anions may not occur at the metal pads or may be sufficiently hindered.

According to various aspects, the insulating inserts 208 and 208a may include a polymer material. The polymer material may be a material with sufficient rigidity towards mechanical shock/rock movements during the process steps of the electroless plating steps. Hence, the rigid polymer may have a tensile Young's modulus value at 25° C. between 500 MPa and 50 GPa. In some aspects, the tensile Young's modulus value at 25° C. may be between 1 GPa and 50 GPa, or between 2 GPa and 30 GPa. Advantageously, at these ranges of rigidity, the polymer material does not wear out physically or chemically in all stages of the plating processes.

In some aspects, the rigid polymer material may be selected from the group consisting of fluorinated polymers, polyether ether ketone, poly(methyl methacrylate), polyepoxide, polycarbonate, and combinations thereof. Advantageously, since the insulating insert 208 and 208a includes these rigid materials, as opposed to materials of less rigidity (e.g., polypropylene), the polymer material may not degrade during the plating processes.

In one aspect, the polymer may be a fluorinated polymer. The fluorinated polymer may be any polymer that contains the element fluorine, wherein the fluorine may be covalently bonded to a carbon backbone. The fluorinated polymer may include interpolymerized monomeric units, which may be derived from monomers. The monomers may include the fluorine. The monomers may be selected from tetrafluoroethylene, vinylidene difluoride, or a combination thereof. Advantageously, because the fluorinated polymer includes fluorine, the fluorinated polymer may be substantially resistant to being dissolved in a range of processing conditions while performing electroless plating process steps, which may be beneficial to the durability of the insulating inserts. In one example, the fluorinated polymer may include polyvinylidene fluoride.

According to various aspects, the insulating insert 208 and 208a may include a thickness of about 10 micrometer or more, e.g., about 10 micrometer to 1 cm. The thickness may depend on the manner in which the insulating insert 208 and 208a is placed into proximity to the basket material, e.g. to the panel end plates 202, or positioned adjacent to each of the opposing slots 206. In one example, the insulating insert 208 and 208a may be a free-standing sheet. In this case, the thickness thereof may be between 1 mm and 1 cm. A higher end of the thickness may provide the necessary stability for the sheet to be free-standing.

In another aspect, the insulating inserts 208 and 208a may be positioned in direct contact with each of the panel end plates 202. In other words, the insulating inserts 208 and 208a may be touching the panel end plates 202 and/or the opposing slots 206. This direct contact may be caused, for example, by the insulating insert 208 and 208a being affixed to selected portions of the panel basket made of the basket material, e.g., the two panel end plates or the opposing slots by fixation means. The fixation means may include screws, nails, adhesive tape, or a combination thereof. The insulating insert 208 and 208a may be a sheet or a film that is affixed to the selected portions of the panel basket made of the basket material. In such aspects, the insulating insert 208 may include a thickness of about 1 millimeter (mm) to about 200 mm, or about 10 mm to about 150 mm, or about 50 mm to about 120 mm. Advantageously, in aspects wherein an insulating insert 208 and 208a is affixed on the basket material, a higher thickness of the insulating insert 208 and 208a may be obtained in contrast to a coating of the insulating insert 208 and 208a (as described below), such as thicknesses above 50 mm. These higher thicknesses of the insulating insert 208 and 208a may have a higher stability during the plating process, in particular during mechanical shock/rock movements of the panel basket 200.

As described above, the direct contact may alternatively be caused, for example, by the insulating insert 208 being coated on the panel end plates 202. In such aspects, the insulating insert 208 may include a thickness of about 10 micrometer to about 200 micrometer, or about 20 micrometer to about 150 micrometer, or about 50 micrometer to about 100 micrometer, or about 100 micrometer. This aspect has the advantage that the coating may be easily applied on the panel end plates 202, thereby facilitating the setup of the process.

Additionally or alternatively to using the insulating inserts 208 and 208a, and according to various aspects, the shielding of the metal pads may include the use of nitric acid for cleaning the panel basket 200 between carrying out the plating process steps. This cleaning step may shield the metal pads from a high, localized concentration of persulfate anions, hydroxyl ions and radicals in the copper pad etching solution by removing the contaminants from the basket material. Advantageously, by preventing the contaminants to be present at the time of the copper pad etching step, the catalytic chain reaction arising from such contaminants may not occur or may be sufficiently hindered. The cleaning of the panel basket 200 with nitric acid may be carried out before the semiconductor panels 204 are placed in the panel basket 200, or after performing electroless plating process steps with the semiconductor panels 204 and the semiconductor panels 204 in the panel basket 200 have been removed. Accordingly, the contaminants precipitated and/or adsorbed on the surface of the panel baskets would be cleaned away, hence, the metal pads are shielded from any reaction products arising from contamination since the contamination would be removed.

Advantageously, the nitric acid may be beneficial to dissolve contaminations from the surface of the panel end plates 202, which would otherwise result in over-etching and/or under-etching of the metal pads. The contaminants may include iron, and/or palladium residues that precipitated on the surface of the panel baskets 200 during or after the palladium-catalyzed activation prior to the electroless plating process.

In an aspect, the cleaning with nitric acid may take about 30 to about 90 minutes to complete, or in another aspect, about 45 to 75 minutes to complete, or a further aspect, about 60 minutes to complete. Nitric acid may advantageously be used since it does not attack the basket material (e.g., stainless steel), which is in contrast to using, for example, hydrochloric acid and aqua regia. At the same time, nitric acid may still retain a significant etch rate for the metal (e.g. copper), in contrast to using, for example, hydrogen fluoride.

In a further aspect, there is provided a plating basket. The plating basket may include: a panel basket 200 configured with two panel end plates 202 and a plurality of opposing slots 206 for carrying semiconductor panels 204 in and out of baths during an electroless plating process. The plating basket may further include an insulating insert 208 and 208a positioned proximal to a basket material.

According to some aspects, the insulating insert 208 may be positioned proximal to each of the panel end plates 202.

According to some aspects, the insulating inserts 208a may be positioned in slots adjacent to each of the panel end plates 202.

Further aspects of the disclosure and advantages described for the insulating inserts 208 and 208a of the previous aspect can be analogously valid for the plating basket, and vice versa. As the various features, material properties and advantages have already been described above and in the examples demonstrated herein, they shall not be iterated for brevity where possible.

Figure 5:
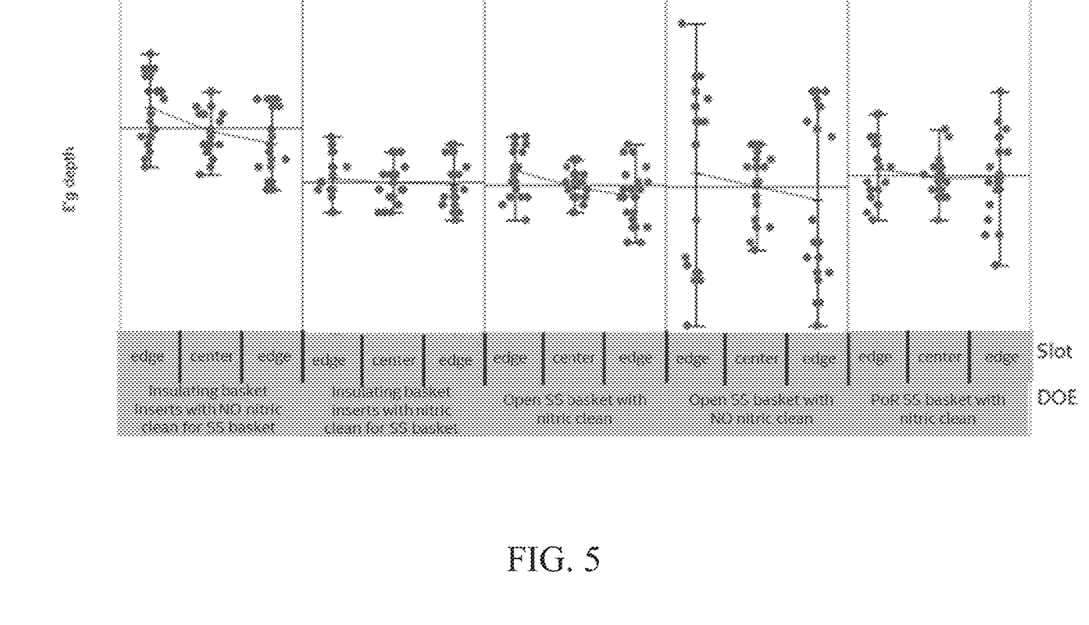
FIG. 5 shows a comparison of the copper pad etch depth as measured by laser profilometry, before and after a copper pad etching pretreatment for a conventional electroless plating process compared with a process according to the invention.

As exemplified in FIG. 5, semiconductor panels may be inserted in edge and center slots (similar to FIG. 3) and different combinations of the present aspects were executed. A stainless steel end plate was used to provide mechanical stability to the semiconductor panels. The copper pad etch data, as shown in FIG. 5, reveal that shielding the semiconductor panels from over-etching and under-etching by using insulating inserts and/or a cleaning with nitric acid successfully prevents over-etching and under-etching at the edge slot semiconductor panels, thereby providing the improved uniformity in terms of metal pad etch.

In particular, a combination of the nitric acid cleaning with using an insulating insert showed the best results in terms of copper pad etch uniformity; followed by using only insulating inserts and eventually using a conventional stainless steel basket with nitric acid clean.

In a first example, there is provided an electroless plating process comprising: providing a panel basket; placing semiconductor panels comprising a plurality of metal pads into the panel basket; shielding the metal pads from contaminants and over-etching and under-etching; and performing electroless plating process steps with the semiconductor panels.

In a second example, the panel basket may be configured with two panel end plates made of the basket material and a plurality of opposing slots for carrying the semiconductor panels in and out of baths during the electroless plating process; and wherein the shielding the metal pads may include providing an insulating insert positioned proximal to a basket material.

In a third example, the basket material may be stainless steel.

In a fourth example, the insulating insert may be positioned at each of the opposing slots.

In a fifth example, the insulating insert may include a fluorinated polymer.

In a sixth example, the fluorinated polymer may include polyvinylidene fluoride.

In a seventh example, the insulating insert may include a thickness of about 10 micrometer or thicker.

In an eighth example, providing the insulating inserts may include direct contact of each of the insulating inserts with each of the panel end plates.

In a ninth example, the direct contact may include the insulating insert being affixed to the panel end plate by fixation means.

In a tenth example, the insulating insert may include a thickness of about 0.4 mm or thicker.

In an eleventh example, the direct contact may include the insulating insert being coated on the panel end plate.

In a twelfth example, the insulating insert may include a thickness of about 10 micrometer to about 200 micrometer.

In a thirteenth example, the shielding the metal pads may include cleaning the panel basket with nitric acid.

In a fourteenth example, the cleaning the panel basket with nitric acid may be carried out before the semiconductor panels are placed in the panel basket.

In a fifteenth example, there is provided a plating basket including: a panel basket made of a basket material configured with two panel end plates and a plurality of opposing slots for carrying semiconductor panels in and out of baths during an electroless plating process; and an insulating insert positioned proximal to a basket material.

In a sixteenth example, each of the insulating inserts may be positioned in slots adjacent to each of the panel end plates.

In a seventeenth example, each of the insulating inserts may be positioned proximal to the opposing slots.

In an eighteenth example, each of the insulating inserts may be in direct contact with each of the panel end plates.

In a nineteenth example, the insulating inserts may be made of a fluorinated polymer.

In a twentieth example, the fluorinated polymer may include polyvinylidene fluoride.

The properties of the insulating insert and the choice of materials presented above are intended to be exemplary for the electroless plating process. It will be apparent to those ordinary skilled practitioners that the foregoing process operations may be modified without departing from the spirit of the present disclosure.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

By "about" in relation to a given numerical value, such as for thickness and height, it is meant to include numerical values within 10% of the specified value.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

The invention claimed is:

1. An electroless plating process comprising:
    providing a panel basket;
    providing semiconductor panels comprising a plurality of metal pads;
    providing a pretreatment etching for the semiconductor panels comprising:
        placing the semiconductor panels into the panel basket made from a basket material;
        shielding the metal pads on the semiconductor panel from contaminants during the pretreatment etching to prevent over-etching and under-etching of the metal pads on the semiconductor panels; and
        performing electroless plating process steps with the semiconductor panels;
    wherein the panel basket is configured with two panel end plates made of the basket material and a plurality of opposing slots for carrying the semiconductor panels in and out of baths during the electroless plating process;
    wherein the semiconductor panels are positioned proximal to each of the panel end plates; and
    wherein the shielding the metal pads comprises providing a distance between the contaminants and the metal pads by positioning an insulating insert between the semiconductor panels and the panel end plates.

2. The electroless plating process of claim 1, wherein the basket material is stainless steel.

3. The electroless plating process of claim 1, wherein the insulating insert is a free-standing sheet positioned at the opposing slots.

4. The electroless plating process of claim 1, wherein the insulating insert comprises a fluorinated polymer.

5. The electroless plating process of claim 3, wherein the fluorinated polymer comprises polyvinylidene fluoride.

6. The electroless plating process of claim 1, wherein the insulating insert comprises a thickness of about 10 micrometers or thicker.

7. The electroless plating process of claim 1, wherein positioning the insulating inserts comprises direct contact of each of the insulating inserts with each of the panel end plates.

8. The electroless plating process of claim 7, wherein the direct contact comprises the insulating insert being affixed to the panel end plate by fixation means.

9. The electroless plating process of claim 8, wherein the insulating insert comprises a thickness of about 0.4 millimeters or thicker.

10. The electroless plating process of claim 7, wherein the direct contact comprises the insulating insert being coated on the panel end plate.

11. The electroless plating process of claim 10, wherein the insulating insert comprises a thickness of about 10 micrometers to about 200 micrometers.

12. The electroless plating process of claim 1, wherein the shielding the metal pads further comprises cleaning the panel basket with nitric acid.

13. The electroless plating process of claim 12, wherein the cleaning the panel basket with nitric acid is carried out before the semiconductor panels are placed in the panel basket.

* * * * *